(12) United States Patent
Fujii

(10) Patent No.: US 6,345,064 B1
(45) Date of Patent: Feb. 5, 2002

(54) SEMICONDUCTOR LASER HAVING AN IMPROVED CURRENT BLOCKING LAYERS AND METHOD OF FORMING THE SAME

(75) Inventor: Hiroaki Fujii, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/188,204

(22) Filed: Nov. 9, 1998

(30) Foreign Application Priority Data

Nov. 7, 1997 (JP) ............................................. 9-306077

(51) Int. Cl.$^7$ ................................................. H01S 5/00
(52) U.S. Cl. .............................. 372/46; 372/46; 372/43; 372/45; 372/34; 372/41
(58) Field of Search .............................. 372/46, 34, 43, 372/45, 41

(56) References Cited

FOREIGN PATENT DOCUMENTS

| JP | 5291680 | 11/1993 |
|----|---------|---------|
| JP | 685396 | 3/1994 |
| JP | 10107368 | 4/1998 |

OTHER PUBLICATIONS

H. Fujii et al., "High–Power Operation of a Transverse–Mode Stabilised AlGaInP Visible Light ($\lambda L$ =683 nm) Semi-conductor Laser," Electronics Letters, Aug. 27, 1987, vol. 23, No. 18.

S. Yamamoto et al., "Visible GaAlAs V–channeled substrate Inner stripe laser with stabilized mode using p–GaAs substrate", pp. 372–374, Appl. Phys. Lett. vol. 40, No. 5, Mar. 1, 1982.

M. Kaminska et al., "Structural properties of As–rich GaAs grown by molecular beam epixtaxy at low temperatures", pp. 1881–1883, Appl. Phys. Lett. vol. 54, No. 19, May 8, 1989.

Primary Examiner—Frank G. Font
Assistant Examiner—Delma R. Flores Ruiz
(74) Attorney, Agent, or Firm—Young & Thompson

(57) ABSTRACT

A semiconductor device provides a current blocking layer for a current confinement, the current blocking layer comprising a compound semiconductor crystalline, wherein the compound semiconductor crystalline has such a deviation from a stoichiometry in compositional ratio as introducing excess point defects into the compound semiconductor crystalline.

45 Claims, 5 Drawing Sheets

SEMICONDUCTOR LASER HAVING AN IMPROVED CURRENT BLOCKING LAYERS AND METHOD OF FORMING THE SAME

BACKGROUND OF THE INVENTION

The present invention relates to a semiconductor device and a method of forming the same, and more particularly to an improvement of current blocking layers in a semiconductor laser device and a method of forming the current blocking layers.

FIG. 1 is a schematic perspective view illustrative of a conventional semiconductor laser device having conventional current blocking layers. FIG. 2 is a diagram illustrative of an energy band gap profile across a double hetero-structure and a conventional current blocking layer as well as a cap layer overlying the conventional current blocking layer when no optical absorption into the current blocking layers appears. FIG. 3 is a diagram illustrative of an energy band gap profile across a double hetero-structure and a conventional current blocking layer as well as a cap layer overlying the conventional current blocking layer when an optical absorption into the current blocking layers appears.

An N-GaAs buffer layer 2 is provided on an n-GaAs substrate 1. An n-AlGaInP first cladding layer 3 is provided on the n-GaAs buffer layer 2. An active layer 4 is provided on the n-AlGaInP first cladding layer 3. The active layer 4 may comprise a multiple quantum well structure which comprises alternating laminations of GaInP well layers and AlGaInP barrier layers. A p-AlGaInP second cladding layer 5 is provided on the active layer 4. A p-GaInP etching stopper layer 6 is also provided on the p-AlGaInP second cladding layer 5. A p-AlGaInP stripe-shaped mesa structure 7 serving as a part of the cladding layer is provided on a selected region of the p-GaInP etching stopper layer 6. A p-GaInP hetero-buffer layer is provided on a top surface of the p-AlGaInP layer. GaAs current blocking layers 9 are provided on the p-GaInP etching stopper layer 6 so that the current blocking layers 9 are positioned in both sides of laminations of the p-AlGaInP stripe-shaped mesa structure 7 and the p-GaInP hetero-buffer layer 8. A p-GaAs cap layer 10 is provided over the p-GaInP hetero-buffer layer 8 and top surfaces of the current blocking layers 9. An n-electrode 11 is provided on a bottom surface of the n-GaAs substrate 1. A p-electrode 12 is also provided on a top surface of the p-GaAs cap layer 10. The above n-GaAs current blocking layers serve not only as a current blocking function for preventing a current leakage to outside of the mesa structure but also as an optical confinement of in a transverse direction due to its absorption of a light emitted from the active layer.

The above conventional laser device is engaged with a problem with an unintended turn-ON operation due to an absorption of a light into the current blocking layers. The current blocking layers are capable of absorbing a light emitted from the active layer, for which reason a part of the light L emitted from the active layer is absorbed into the current blocking layers. The absorption of the light into the current blocking layers generates electron-hole pairs whereby generated electrons are excited and lie on a conduction band of the current blocking layers whilst generated holes lie on a valence band of the current blocking layers. If a thickness of the current blocking layers is smaller than a diffusion length of holes as minority carriers in the current blocking layers, then the generated holes are diffused into adjacent layers, for example, the p-AlGaInP cladding layer 5 and the p-GaAs cap layer 10, whilst the generated electrons are accumulated in the current blocking layers. This causes a potential barrier drop of the current blocking layers whereby the balance band is made flat as illustrated in FIG. 3. As a result, a leakage of current of the holes as minority carriers toward the active layer appears. Namely, the current blocking layers are no longer capable of exhibiting current blocking functions. This mechanism was reported by S. Yamamoto et al. in Applied Physics Letters, vol. 40, pp. 372–374. 1982.

In order to avoid the above problem, it is required that the current blocking layers have a thickness which is sufficiently larger than the diffusion length of the minority carriers of the holes and also required that a dopant concentration of the current blocking layers is sufficiently risen. The increase in thickness of the current blocking layers also requires the increase in height of the mesa structure. The increase in height of the mesa structure narrows a width of a top portion of the mesa structure. The narrowing of the width of the top portion of the mesa structure increases a resistance to the current of the laser device. The increase in dopant concentration of the current blocking layers may raise a problem with a deterioration in surface homology of the current blocking layers and the cap layer overlying the current blocking layers.

In the above circumstances, it had been required to develop a novel laser device having improved current blocking layers free from the above problems.

SUMMARY OF THE INVENTION

Accordingly, it is an object of the present invention to provide a novel laser device having improved current blocking layers free from the above problems.

It is a further object of the present invention to provide a novel method of forming a laser device having improved current blocking layers free from the above problems.

It is a still further object of the present invention to provide an improved current blocking layer in a novel laser device free from the above problems.

It is yet a further object of the present invention to provide a novel method of forming an improved current blocking layer in a novel laser device free from the above problems.

The present invention provides a current blocking layer for a current confinement, the current blocking layer comprising a compound semiconductor crystalline, wherein the compound semiconductor crystalline has such a deviation from a stoichiometry in compositional ratio as introducing excess point defects into the compound semiconductor crystalline.

The present invention also provides a method of forming a current confinement structure in a semiconductor laser device. The method comprises the steps of: forming a cladding layer having a mesa structure and flat surface portions outside the mesa structure; and forming current blocking layers extending at least both on the flat surface portions of the mesa structure and on side faces of the mesa structure of the cladding layer, where each of the current blocking layers comprises a compound semiconductor crystalline, wherein the compound semiconductor crystalline is grown at a temperature of not higher than 0.4 times of a melting point of the compound semiconductor crystalline in an absolute temperature scale.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
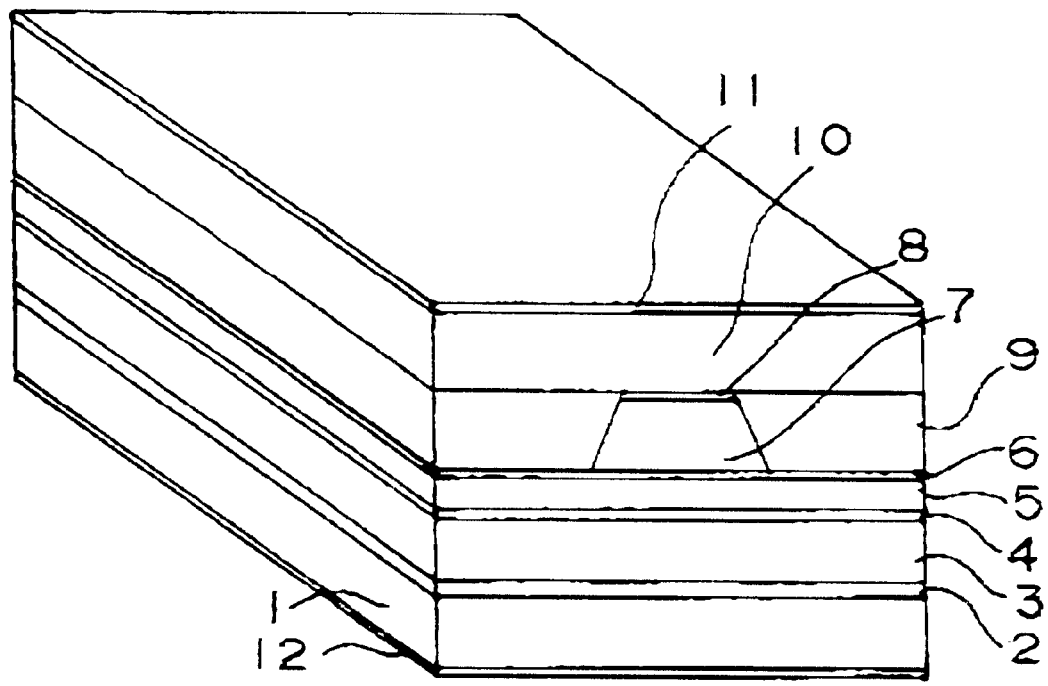
FIG. 1 is a schematic perspective view illustrative of a conventional semiconductor laser device having conventional current blocking layers.
Figure 2:
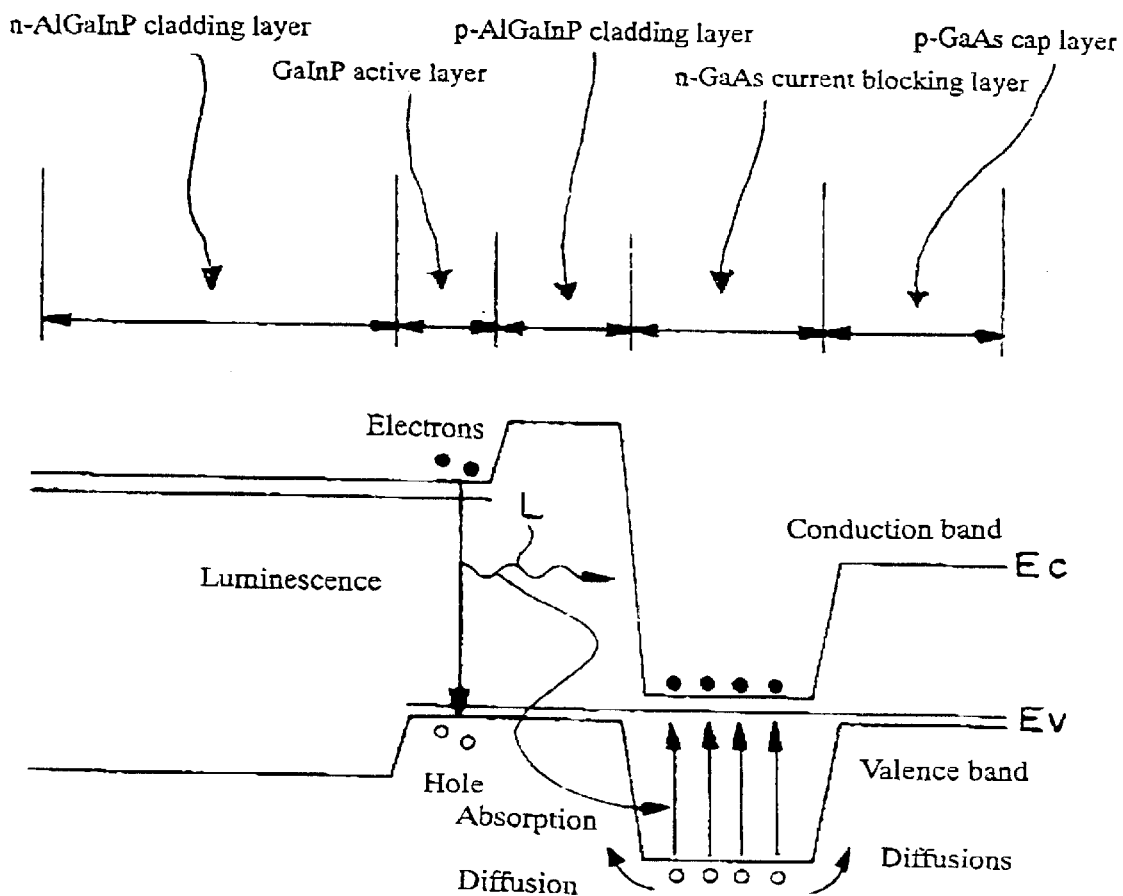
FIG. 2 is a diagram illustrative of an energy band gap profile across a double hetero-structure and a conventional current blocking layer as well as a cap layer overlying the conventional current blocking layer when no optical absorption into the current blocking layers appears.
Figure 3:
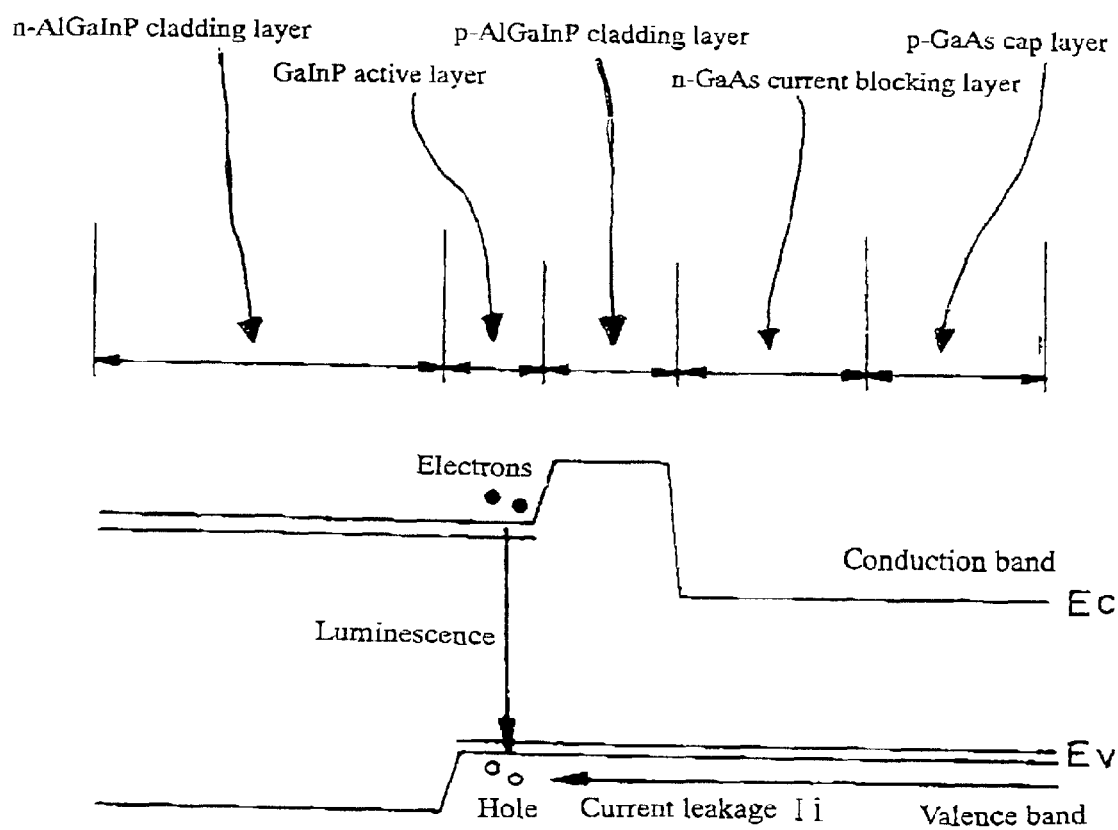
FIG. 3 is a diagram illustrative of an energy band gap profile across a double hetero-structure and a conventional current blocking layer as well as a cap layer overlying the conventional current blocking layer when an optical absorption into the current blocking layers appears.

The first present invention provides a current blocking layer for a current confinement, the current blocking layer comprising a compound semiconductor crystalline, wherein the compound semiconductor crystalline has such a deviation from a stoichiometry in compositional ratio as introducing excess point defects into the compound semiconductor crystalline.

In accordance with the first present invention, the deviation from the stoichiometry in compositional ratio of the compound semiconductor crystalline of the current blocking layer results in introduction of excess point defects into the compound semiconductor crystalline. The excess point defects are capable of permitting non-luminance re-combinations of minority and majority carriers. A light is absorbed into the compound semiconductor crystalline of the current blocking layer, whereby electron hole pairs are generated in the compound semiconductor crystalline. The generated electrons are excited and lie on a conduction band of the compound semiconductor crystalline of the current blocking layer, whilst the generated holes lie on a valence band of the compound semiconductor crystalline of the current blocking layer. The excess point defects provide non-luminance re-combination centers of the electrons and holes, whereby the re-combination of the electrons and holes without luminance are promoted. This means that the non-luminance re-combination by the excess point defects shortens a life time of carriers, for example, electrons and holes in the compound semiconductor crystalline of the current blocking layer. This means that shortening the carrier life time shortens a diffusion length of the carriers. Namely, there appears no diffusion of minority carriers over the current blocking layer to adjacent layers nor accumulation of minority carriers in the current blocking layer, resulting in no variation of the energy band gap of the current blocking layer nor drop of potential barriers of the current blocking layer. If the above novel current blocking layer is applied to the semiconductor optical device, then such the semiconductor optical device dos not show any unintended turn-ON operation.

The above deviation from the stoichiometry in compositional ratio of the compound semiconductor crystalline of the current blocking layer may, for example, be obtainable by a low temperature growth of the compound semiconductor crystalline at a temperature of not higher than 0.4 times of a melting point of the compound semiconductor crystalline in an absolute temperature scale.

It is also preferable that the current blocking layer has a thickness which is larger than the diffusion length of the minority carriers in the compound semiconductor crystalline of the current blocking layer. As described above, the diffusion length of the minority carriers in the compound semiconductor crystalline of the current blocking layer is shortened by the excess point defects introduced by the deviation from the stoichiometry in compositional ratio of the compound semiconductor crystalline, for which reason a preferable range in thickness of the current blocking layer is widen. This means that a minimum value in the preferable thickness range of the current blocking layer is made thin. If the current blocking layer is provided in opposite sides of a mesa structure of a semiconductor optical device so that a top surface of the current blocking layer is leveled to a top portion of the mesa structure, then it is permitted to design the height of the mesa structure to be low by designing the thickness of the current blocking layer to be thin.

Further, no variation of the energy band gap of the current blocking layer nor drop of potential barriers of the current blocking layer makes it unnecessary that the current blocking layer has a high dopant concentration. This prevents deterioration in surface homology of the current blocking layer and a layer overlying the current blocking layer.

It is also preferable that the compound semiconductor crystalline comprises an As-based compound semiconductor crystalline.

It is further preferable that the As-based compound semiconductor crystalline includes at least one selected from the group consisting of GaAs, AlGaAs and AlAs.

It is also preferable that the compound semiconductor crystalline comprises a Group III-V compound semiconductor crystalline.

The second present invention provides a current confinement structure in a semiconductor laser device. The current confinement structure comprises: a cladding layer having a mesa structure and flat surface portions outside the mesa structure; and current blocking layers extending at least both on the flat surface portions of the mesa structure and on side faces of the mesa structure of the cladding layer, and each of the current blocking layers comprising a compound semiconductor crystalline, wherein the compound semiconductor crystalline has such a deviation from a stoichiometry in compositional ratio as introducing excess point defects into the compound semiconductor crystalline.

In accordance with the second present invention, the deviation from the stoichiometry in compositional ratio of the compound semiconductor crystalline of the current blocking layer results in introduction of excess point defects into the compound semiconductor crystalline. The excess point defects are capable of permitting non-luminance re-combinations of minority and majority carriers. A light is absorbed into the compound semiconductor crystalline of the current blocking layer, whereby electron hole pairs are generated in the compound semiconductor crystalline. The generated electrons are excited and lie on a conduction band of the compound semiconductor crystalline of the current blocking layer, whilst the generated holes lie on a valence band of the compound semiconductor crystalline of the current blocking layer. The excess point defects provide non-luminance re-combination centers of the electrons and holes, whereby the re-combination of the electrons and holes without luminance are promoted. This means that the non-luminance re-combination by the excess point defects shortens a life time of carriers, for example, electrons and holes in the compound semiconductor crystalline of the current blocking layer. This means that shortening the carrier life time shortens a diffusion length of the carriers. Namely, there appears no diffusion of minority carriers over the current blocking layer to adjacent layers nor accumulation of minority carriers in the current blocking layer, resulting in no variation of the energy band gap of the current blocking layer nor drop of potential barriers of the current blocking layer. If the above novel current blocking layer is applied to the semiconductor optical device, then such the semiconductor optical device dos not show any unintended turn-ON operation.

The above deviation from the stoichiometry in compositional ratio of the compound semiconductor crystalline of the current blocking layer may, for example, be obtainable by a low temperature growth of the compound semiconductor crystalline at a temperature of not higher than 0.4 times of a melting point of the compound semiconductor crystalline in an absolute temperature scale.

It is also preferable that the current blocking layer has a thickness which is larger than the diffusion length of the minority carriers in the compound semiconductor crystalline of the current blocking layer. As described above, the diffusion length of the minority carriers in the compound semiconductor crystalline of the current blocking layer is shortened by the excess point defects introduced by the deviation from the stoichiometry in compositional ratio of the compound semiconductor crystalline, for which reason a preferable range in thickness of the current blocking layer is widen. This means that a minimum value in the preferable thickness range of the current blocking layer is made thin. If the current blocking layer is provided in opposite sides of a mesa structure of a semiconductor optical device so that a top surface of the current blocking layer is leveled to a top portion of the mesa structure, then it is permitted to design the height of the mesa structure to be low by designing the thickness of the current blocking layer to be thin.

Further, no variation of the energy band gap of the current blocking layer nor drop of potential barriers of the current blocking layer makes it unnecessary that the current blocking layer has a high dopant concentration. This prevents deterioration in surface homology of the current blocking layer and a layer overlying the current blocking layer.

It is also preferable that the compound semiconductor crystalline comprises an As-based compound semiconductor crystalline.

It is further preferable that the As-based compound semiconductor crystalline includes at least one selected from the group consisting of GaAs, AlGaAs and AlAs.

It is also preferable that the compound semiconductor crystalline comprises a Group III-V compound semiconductor crystalline.

The third present invention provides a current blocking layer for a current confinement. The current blocking layer comprising a compound semiconductor crystalline, wherein the compound semiconductor crystalline has excess point defects which are capable of permitting non-luminance re-combinations of minority and majority carriers.

In accordance with the third present invention, the excess point defects are introduced into the compound semiconductor crystalline. The excess point defects are capable of permitting non-luminance re-combinations of minority and majority carriers. A light is absorbed into the compound semiconductor crystalline of the current blocking layer, whereby electron hole pairs are generated in the compound semiconductor crystalline. The generated electrons are excited and lie on a conduction band of the compound semiconductor crystalline of the current blocking layer, whilst the generated holes lie on a valance band of the compound semiconductor crystalline of the current blocking layer. The excess point defects provide non-luminance re-combination centers of the electrons and holes, whereby the re-combination of the electrons and holes without luminance are promoted. This means that the non-luminance re-combinations by the excess point defects shortens a life time of carriers, for example, electrons and holes in the compound semiconductor crystalline of the current blocking layer. This means that shortening the carrier life time shortens a diffusion length of the carriers. Namely, there appears no diffusion of minority carriers over the current blocking layer to adjacent layers nor accumulation of minority carriers in the current blocking layer, resulting in no variation of the energy band gap of the current blocking layer nor drop of potential barriers of the current blocking layer. If the above novel current blocking layer is applied to the semiconductor optical device, then such the semiconductor optical device dos not show any unintended turn-ON operation.

The above excess point defects may be introduced by a deviation from the stoichiometry in compositional ratio of the compound semiconductor crystalline of the current blocking layer. This deviation from the stoichiometry in compositional ratio of the compound semiconductor crystalline may, for example, be obtainable by a low temperature growth of the compound semiconductor crystalline at a temperature of not higher than 0.4 times of a melting point of the compound semiconductor crystalline in an absolute temperature scale.

It is also preferable that the current blocking layer has a thickness which is larger than the diffusion length of the minority carriers in the compound semiconductor crystalline of the current blocking layer. As described above, the diffusion length of the minority carriers in the compound semiconductor crystalline of the current blocking layer is shortened by the excess point defects introduced by the deviation from the stoichiometry in compositional ratio of the compound semiconductor crystalline, for which reason a preferable range in thickness of the current blocking layer is widen. This means that a minimum value in the preferable thickness range of the current blocking layer is made thin. If the current blocking layer is provided in opposite sides of a mesa structure of a semiconductor optical device so that a top surface of the current blocking layer is leveled to a top portion of the mesa structure, then it is permitted to design the height of the mesa structure to be low by designing the thickness of the current blocking layer to be thin.

Further, no variation of the energy band gap of the current blocking layer nor drop of potential barriers of the current blocking layer makes it unnecessary that the current blocking layer has a high dopant concentration. This prevents deterioration in surface homology of the current blocking layer and a layer overlying the current blocking layer.

It is also preferable that the compound semiconductor crystalline comprises an As-based compound semiconductor crystalline.

It is further preferable that the As-based compound semiconductor crystalline includes at least one selected from the group consisting of GaAs, AlGaAs and AlAs.

It is also preferable that the compound semiconductor crystalline comprises a Group III-V compound semiconductor crystalline.

The fourth present invention provides a current confinement structure in a semiconductor laser device. The current confinement structure comprises: a cladding layer having a mesa structure and flat surface portions outside the mesa structure; and current blocking layers extending at least both on the flat surface portions of the mesa structure and on side faces of the mesa structure of the cladding layer, and each of the current blocking layers comprising a compound semiconductor crystalline, wherein the compound semiconductor crystalline has excess point defects which are capable of permitting non-luminance re-combinations of minority and majority carriers.

In accordance with the fourth present invention, the excess point defects are introduced into the compound semiconductor crystalline. The excess point defects are capable of permitting non-luminance re-combinations of minority and majority carriers. A light is absorbed into the compound semiconductor crystalline of the current blocking layer, whereby electron hole pairs are generated in the compound semiconductor crystalline. The generated electrons are excited and lie on a conduction band of the compound semiconductor crystalline of the current blocking layer, whilst the generated holes lie on a valence band of the compound semiconductor crystalline of the current blocking layer. The excess point defects provide non-luminance re-combination centers of the electrons and holes, whereby the re-combination of the electrons and holes without luminance are promoted. This means that the non-luminance re-combination by the excess point defects shortens a life time of carriers, for example, electrons and holes in the compound semiconductor crystalline of the current blocking layer. This means that shortening the carrier life time shortens a diffusion length of the carriers. Namely, there appears no diffusion of minority carriers over the current blocking layer to adjacent layers nor accumulation of minority carriers in the current blocking layer, resulting in no variation of the energy band gap of the current blocking layer nor drop of potential barriers of the current blocking layer. If the above novel current blocking layer is applied to the semiconductor optical device, then such the semiconductor optical device dos not show any unintended turn-ON operation.

The above excess point defects may be introduced by a deviation from the stoichiometry in compositional ratio of the compound semiconductor crystalline of the current blocking layer. This deviation from the stoichiometry in compositional ratio of the compound semiconductor crystalline may, for example, be obtainable by a low temperature growth of the compound semiconductor crystalline at a temperature of not higher than 0.4 times of a melting point of the compound semiconductor crystalline in an absolute temperature scale.

It is also preferable that the current blocking layer has a thickness which is larger than the diffusion length of the minority carriers in the compound semiconductor crystalline of the current blocking layer. As described above, the diffusion length of the minority carriers in the compound semiconductor crystalline of the current blocking layer is shortened by the excess point defects introduced by the deviation from the stoichiometry in compositional ratio of the compound semiconductor crystalline, for which reason a preferable range in thickness of the current blocking layer is widen. This means that a minimum value in the preferable thickness range of the current blocking layer is made thin. If the current blocking layer is provided in opposite sides of a mesa structure of a semiconductor optical device so that a top surface of the current blocking layer is leveled to a top portion of the mesa structure, then it is permitted to design the height of the mesa structure to be low by designing the thickness of the current blocking layer to be thin.

Further, no variation of the energy band gap of the current blocking layer nor drop of potential barriers of the current blocking layer makes it unnecessary that the current blocking layer has a high dopant concentration. This prevents deterioration in surface homology of the current blocking layer and a layer overlying the current blocking layer It is also preferable that the compound semiconductor crystalline comprises an As-based compound semiconductor crystalline.

It is further preferable that the As-based compound semiconductor crystalline includes at least one selected from the group consisting of GaAs, AlGaAs and AlAs.

It is also preferable that the compound semiconductor crystalline comprises a Group III-V compound semiconductor crystalline.

The fifth present invention provides a current blocking layer for an current confinement, the current blocking layer comprising a compound semiconductor crystalline, wherein the compound semiconductor crystalline has been grown at a temperature of not higher than 0.4 times of a melting point of the compound semiconductor crystalline in an absolute temperature scale so that the compound semiconductor crystalline has such a deviation from a stoichiometry in compositional ratio as to introduce excess point defects into the compound semiconductor crystalline.

In accordance with the fifth present invention, the current blocking layer is grown by a low temperature growth of the compound semiconductor crystalline at a temperature of not higher than 0.4 times of a melting point of the compound semiconductor crystalline in an absolute temperature scale, so as to obtain a deviation from the stoichiometry in compositional ratio of the compound semiconductor crystalline of the current blocking layer. This deviation from the stoichiometry in compositional ratio of the compound semiconductor crystalline introduces the excess point defects into the compound semiconductor crystalline. The excess point defects are capable of permitting non-luminance re-combinations of minority and majority carriers. A light is absorbed into the compound semiconductor crystalline of the current blocking layer, whereby electron hole pairs are generated in the compound semiconductor crystalline. The generated electrons are excited and lie on a conduction band of the compound semiconductor crystalline of the current blocking layer, whilst the generated holes lie on a valence band of the compound semiconductor crystalline of the current blocking layer. The excess point defects provide non-luminance re-combination centers of the electrons and holes, whereby the re-combination of the electrons and holes without luminance are promoted. This means that the non-luminance re-combination by the excess point defects shortens a life time of carriers, for example, electrons and holes in the compound semiconductor crystalline of the current blocking layer. This means that shortening the carrier life time shortens a diffusion length of the carriers. Namely, there appears no diffusion of minority carriers over the current blocking layer to adjacent layers nor accumulation of minority carriers in the current blocking layer, resulting in no variation of the energy band gap of the current blocking layer nor drop of potential barriers of the current blocking layer. If the above novel current blocking layer is applied to the semiconductor optical device, then such the semiconductor optical device dos not show any unintended turn-ON operation.

It is also preferable that the current blocking layer has a thickness which is larger than the diffusion length of the minority carriers in the compound semiconductor crystalline of the current blocking layer. As described above, the diffusion length of the minority carriers in the compound semiconductor crystalline of the current blocking layer is shortened by the excess point defects introduced by the deviation from the stoichiometry in compositional ratio of the compound semiconductor crystalline, for which reason a preferable range in thickness of the current blocking layer is widen. This means that a minimum value in the preferable thickness range of the current blocking layer is made thin. If the current blocking layer is provided in opposite sides of a mesa structure of a semiconductor optical device so that a top surface of the current blocking layer is leveled to a top portion of the mesa structure, then it is permitted to design the height of the mesa structure to be low by designing the thickness of the current blocking layer to be thin.

Further, no variation of the energy band gap of the current blocking layer nor drop of potential barriers of the current blocking layer makes it unnecessary that the current blocking layer has a high dopant concentration. This prevents deterioration in surface homology of the current blocking layer and a layer overlying the current blocking layer.

It is also preferable that the compound semiconductor crystalline comprises an As-based compound semiconductor crystalline.

It is further preferable that the As-based compound semiconductor crystalline includes at least one selected from the group consisting of GaAs, AlGaAs and AlAs.

It is also preferable that the compound semiconductor crystalline comprises a Group III-V compound semiconductor crystalline.

The sixth present invention provides a current confinement structure in a semiconductor laser device, the current confinement structure comprising: a cladding layer having a mesa structure and flat surface portions outside the mesa structure; and current blocking layers extending at least both on the flat surface portions of the mesa structure and on side faces of the mesa structure of the cladding layer, and each of the current blocking layers comprising a compound semiconductor crystalline, wherein the compound semiconductor crystalline has been grown at a temperature of not higher than 0.4 times of a melting point of the compound semiconductor crystalline in an absolute temperature scale so that the compound semiconductor crystalline has such a deviation from a stoichiometry in compositional ratio as to introduce excess point defects into the compound semiconductor crystalline.

In accordance with the sixth present invention, the current blocking layer is grown by a low temperature growth of the compound semiconductor crystalline at a temperature of not higher than 0.4 times of a melting point of the compound semiconductor crystalline in an absolute temperature scale, so as to obtain a deviation from the stoichiometry in compositional ratio of the compound semiconductor crystalline of the current blocking layer. This deviation from the stoichiometry in compositional ratio of the compound semiconductor crystalline introduces the excess point defects into the compound semiconductor crystalline. The excess point defects are capable of permitting non-luminance re-combinations of minority and majority carriers. A light is absorbed into the compound semiconductor crystalline of the current blocking layer, whereby electron hole pairs are generated in the compound semiconductor crystalline. The generated electrons are excited and lie on a conduction band of the compound semiconductor crystalline of the current blocking layer, whilst the generated holes lie on a valence band of the compound semiconductor crystalline of the current blocking layer. The excess point defects provide non-luminance re-combination centers of the electrons and holes, whereby the re-combination of the electrons and holes without luminance are promoted. This means that the non-luminance re-combination by the excess point defects shortens a life time of carriers, for example, electrons and holes in the compound semiconductor crystalline of the current blocking layer. This means that shortening the carrier life time shortens a diffusion length of the carriers. Namely, there appears no diffusion of minority carriers over the current blocking layer to adjacent layers nor accumulation of minority carriers in the current blocking layer, resulting in no variation of the energy band gap of the current blocking layer nor drop of potential barriers of the current blocking layer. If the above novel current blocking layer is applied to the semiconductor optical device, then such the semiconductor optical device dos not show any unintended turn-ON operation.

It is also preferable that the current blocking layer has a thickness which is larger than the diffusion length of the minority carriers in the compound semiconductor crystalline of the current blocking layer. As described above, the diffusion length of the minority carriers in the compound semiconductor crystalline of the current blocking layer is shortened by the excess point defects introduced by the deviation from the stoichiometry in compositional ratio of the compound semiconductor crystalline, for which reason a preferable range in thickness of the current blocking layer is widen. This means that a minimum value in the preferable thickness range of the current blocking layer is made thin. If the current blocking layer is provided in opposite sides of a mesa structure of a semiconductor optical device so that a top surface of the current blocking layer is leveled to a top portion of the mesa structure, then it is permitted to design the height of the mesa structure to be low by designing the thickness of the current blocking layer to be thin.

Further, no variation of the energy band gap of the current blocking layer nor drop of potential barriers of the current blocking layer makes it unnecessary that the current blocking layer has a high dopant concentration. This prevents deterioration in surface homology of the current blocking layer and a layer overlying the current blocking layer.

It is also preferable that the compound semiconductor crystalline comprises an As-based compound semiconductor crystalline.

It is further preferable that the As-based compound semiconductor crystalline includes at least one selected from the group consisting of GaAs, AlGaAs and AlAs.

It is also preferable that the compound semiconductor crystalline comprises a Group III-V compound semiconductor crystalline.

The seventh present invention provides a semiconductor laser comprising: a compound semiconductor substrate of a first conductivity type; a double-hetero structure provided over the compound semiconductor substrate, and the double-hetero structure having an upper flat surface; a mesa structure of a second conductivity type provided on a selected region of the upper flat surface of the double-hetero structure, and the mesa structure having sloped side faces; current blocking layers of the first conductivity type, each of the current blocking layers extending both on an unselected region of the flat surface of the double-hetero structure and on the sloped side face of the mesa structure; and a compound semiconductor contact layer of the second conductivity type extending over a top surface of the mesa structure and the current blocking layers, wherein each of the current blocking layers comprises a compound semiconductor crystalline which has such a deviation from a stoichiometry in compositional ratio as introducing excess point defects into the compound semiconductor crystalline.

In accordance with the seventh present invention, the deviation from the stoichiometry in compositional ratio of the compound semiconductor crystalline of the current blocking layer results in introduction of excess point defects into the compound semiconductor crystalline. The excess point defects are capable of permitting non-luminance re-combinations of minority and majority carriers. A light is absorbed into the compound semiconductor crystalline of the current blocking layer, whereby electron hole pairs are generated in the compound semiconductor crystalline. The generated electrons are excited and lie on a conduction band of the compound semiconductor crystalline of the current blocking layer, whilst the generated holes lie on a valence band of the compound semiconductor crystalline of the current blocking layer. The excess point defects provide non-luminance re-combination centers of the electrons and holes, whereby the re-combination of the electrons and holes without luminance are promoted. This means that the non-luminance re-combination by the excess point defects shortens a life time of carriers, for example, electrons and holes in the compound semiconductor crystalline of the current blocking layer. This means that shortening the carrier life time shortens a diffusion length of the carriers. Namely, there appears no diffusion of minority carriers over the current blocking layer to adjacent layers nor accumulation of minority carriers in the current blocking layer, resulting in no variation of the energy band gap of the current blocking layer nor drop of potential barriers of the current blocking layer. If the above novel current blocking layer is applied to the semiconductor optical device, then such the semiconductor optical device dos not show any unintended turn-ON operation.

The above deviation from the stoichiometry in compositional ratio of the compound semiconductor crystalline of the current blocking layer may, for example, be obtainable by a low temperature growth of the compound semiconductor crystalline at a temperature of not higher than 0.4 times of a melting point of the compound semiconductor crystalline in an absolute temperature scale.

It is also preferable that the current blocking layer has a thickness which is larger than the diffusion length of the minority carriers in the compound semiconductor crystalline of the current blocking layer. As described above, the diffusion length of the minority carriers in the compound semiconductor crystalline of the current blocking layer is shortened by the excess point defects introduced by the deviation from the stoichiometry in compositional ratio of the compound semiconductor crystalline, for which reason a preferable range in thickness of the current blocking layer is widen. This means that a minimum value in the preferable thickness range of the current blocking layer is made thin. If the current blocking layer is provided in opposite sides of a mesa structure of a semiconductor optical device so that a top surface of the current blocking layer is leveled to a top portion of the mesa structure, then it is permitted to design the height of the mesa structure to be low by designing the thickness of the current blocking layer to be thin.

Further, no variation of the energy band gap of the current blocking layer nor drop of potential barriers of the current blocking layer makes it unnecessary that the current blocking layer has a high dopant concentration. This prevents deterioration in surface homology of the current blocking layer and a layer overlying the current blocking layer.

It is also preferable that the compound semiconductor crystalline comprises an As-based compound semiconductor crystalline.

It is further preferable that the As-based compound semiconductor crystalline includes at least one selected from the group consisting of GaAs, AlGaAs and AlAs.

It is also preferable that the compound semiconductor crystalline comprises a Group III-V compound semiconductor crystalline.

The eighth present invention provides a semiconductor laser comprising: a compound semiconductor substrate of a first conductivity type; a double-hetero structure provided over the compound semiconductor substrate, and the double-hetero structure having an upper flat surface; a mesa structure of a second conductivity type provided on a selected region of the upper flat surface of the double-hetero structure, and the mesa structure having sloped side faces; current blocking layers of the first conductivity type, each of the current blocking layers extending both on an unselected region of the flat surface of the double-hetero structure and on the sloped side face of the mesa structure; and a compound semiconductor contact layer of the second conductivity type extending over a top surface of the mesa structure and the current blocking layers, wherein each of the current blocking layers comprises a compound semiconductor crystalline which has excess point defects which are capable of permitting non-luminance re-combinations of minority and majority carriers.

In accordance with the eighth present invention, the excess point defects are introduced into the compound semiconductor crystalline. The excess point defects are capable of permitting non-luminance re-combinations of minority and majority carriers. A light is absorbed into the compound semiconductor crystalline of the current blocking layer, whereby electron hole pairs are generated in the compound semiconductor crystalline. The generated electrons are excited and lie on a conduction band of the compound semiconductor crystalline of the current blocking layer, whilst the generated holes lie on a valence band of the compound semiconductor crystalline of the current blocking layer. The excess point defects provide non-luminance re-combination centers of the electrons and holes, whereby the re-combination of the electrons and holes without luminance are promoted. This means that the non-luminance re-combination by the excess point defects shortens a life time of carriers, for example, electrons and holes in the compound semiconductor crystalline of the current blocking layer. This means that shortening the carrier life time shortens a diffusion length of the carriers. Namely, there appears no diffusion of minority carriers over the current blocking layer to adjacent layers nor accumulation of minority carriers in the current blocking layer, resulting in no variation of the energy band gap of the current blocking layer nor drop of potential barriers of the current blocking layer. If the above novel current blocking layer is applied to the semiconductor optical device, then such the semiconductor optical device dos not show any unintended turn-ON operation.

The above excess point defects may be introduced by a deviation from the stoichiometry in compositional ratio of the compound semiconductor crystalline of the current blocking layer. This deviation from the stoichiometry in compositional ratio of the compound semiconductor crystalline may, for example, be obtainable by a low temperature growth of the compound semiconductor crystalline at a temperature of not higher than 0.4 times of a melting point of the compound semiconductor crystalline in an absolute temperature scale.

It is also preferable that the current blocking layer has a thickness which is larger than the diffusion length of the minority carriers in the compound semiconductor crystalline of the current blocking layer. As described above, the diffusion length of the minority carriers in the compound semiconductor crystalline of the current blocking layer is shortened by the excess point defects introduced by the deviation from the stoichiometry in compositional ratio of the compound semiconductor crystalline, for which reason a preferable range in thickness of the current blocking layer is widen. This means that a minimum value in the preferable thickness range of the current blocking layer is made thin. If the current blocking layer is provided in opposite sides of a mesa structure of a semiconductor optical device so that a top surface of the current blocking layer is leveled to a top portion of the mesa structure, then it is permitted to design the height of the mesa structure to be low by designing the thickness of the current blocking layer to be thin.

Further, no variation of the energy band gap of the current blocking layer nor drop of potential barriers of the current blocking layer makes it unnecessary that the current blocking layer has a high dopant concentration. This prevents deterioration in surface homology of the current blocking layer and a layer overlying the current blocking layer.

It is also preferable that the compound semiconductor crystalline comprises an As-based compound semiconductor crystalline.

It is further preferable that the As-based compound semiconductor crystalline includes at least one selected from the group consisting of GaAs, AlGaAs and AlAs.

It is also preferable that the compound semiconductor crystalline comprises a Group III-V compound semiconductor crystalline.

The ninth present invention provides a semiconductor laser comprising: a compound semiconductor substrate of a first conductivity type; a double-hetero structure provided over the compound semiconductor substrate, and the double-hetero structure having an upper flat surface; a mesa structure of a second conductivity type provided on a selected region of the upper flat surface of the double-hetero structure, and the mesa structure having sloped side faces; current blocking layers of the first conductivity type, each of the current blocking layers extending both on an unselected region of the flat surface of the double-hetero structure and on the sloped side face of the mesa structure; and a compound semiconductor contact layer of the second conductivity type extending over a top surface of the mesa structure and the current blocking layers, wherein each of the current blocking layers comprises a compound semiconductor crystalline which has been grown at a temperature of not higher than 0.4 times of a melting point of the compound semiconductor crystalline in an absolute temperature scale so that the compound semiconductor crystalline has such a deviation from a stoichiometry in compositional ratio as to introduce excess point defects into the compound semiconductor crystalline.

In accordance with the ninth present invention, the current blocking layer is grown by a low temperature growth of the compound semiconductor crystalline at a temperature of not higher than 0.4 times of a melting point of the compound semiconductor crystalline in an absolute temperature scale, so as to obtain a deviation from the stoichiometry in compositional ratio of the compound semiconductor crystalline of the current blocking layer. This deviation from the stoichiometry in compositional ratio of the compound semiconductor crystalline introduces the excess point defects into the compound semiconductor crystalline. The excess point defects are capable of permitting non-luminance re-combinations of minority and majority carriers. A light is absorbed into the compound semiconductor crystalline of the current blocking layer, whereby electron hole pairs are generated in the compound semiconductor crystalline. The generated electrons are excited and lie on a conduction band of the compound semiconductor crystalline of the current blocking layer, whilst the generated holes lie on a valence band of the compound semiconductor crystalline of the current blocking layer. The excess point defects provide non-luminance re-combination centers of the electrons and holes, whereby the re-combination of the electrons and holes without luminance are promoted. This means that the non-luminance re-combination by the excess point defects shortens a life time of carriers, for example, electrons and holes in the compound semiconductor crystalline of the current blocking layer. This means that shortening the carrier life time shortens a diffusion length of the carriers. Namely, there appears no diffusion of minority carriers over the current blocking layer to adjacent layers nor accumulation of minority carriers in the current blocking layer, resulting in no variation of the energy band gap of the current blocking layer nor drop of potential barriers of the current blocking layer. If the above novel current blocking layer is applied to the semiconductor optical device, then such the semiconductor optical device dos not show any unintended turn-ON operation.

It is also preferable that the current blocking layer has a thickness which is larger than the diffusion length of the minority carriers in the compound semiconductor crystalline of the current blocking layer. As described above, the diffusion length of the minority carriers in the compound semiconductor crystalline of the current blocking layer is shortened by the excess point defects introduced by the deviation from the stoichiometry in compositional ratio of the compound semiconductor crystalline, for which reason a preferable range in thickness of the current blocking layer is widen. This means that a minimum value in the preferable thickness range of the current blocking layer is made thin. If the current blocking layer is provided in opposite sides of a mesa structure of a semiconductor optical device so that a top surface of the current blocking layer is leveled to a top portion of the mesa structure, then it is permitted to design the height of the mesa structure to be low by designing the thickness of the current blocking layer to be thin.

Further, no variation of the energy band gap of the current blocking layer nor drop of potential barriers of the current blocking layer makes it unnecessary that the current blocking layer has a high dopant concentration. This prevents deterioration in surface homology of the current blocking layer and a layer overlying the current blocking layer.

It is also preferable that the compound semiconductor crystalline comprises an As-based compound semiconductor crystalline.

It is further preferable that the As-based compound semiconductor crystalline includes at least one selected from the group consisting of GaAs, AlGaAs and AlAs.

It is also preferable that the compound semiconductor crystalline comprises a Group III-V compound semiconductor crystalline.

The tenth present invention provides a method of forming a current blocking layer which comprises a compound semiconductor crystalline. The method comprises the step of: growing the compound semiconductor crystalline at a temperature of not higher than 0.4 times of a melting point of the compound semiconductor crystalline in an absolute temperature scale.

In accordance with the tenth present invention, the current blocking layer is grown by a low temperature growth of the compound semiconductor crystalline at a temperature of not higher than 0.4 times of a melting point of the compound semiconductor crystalline in an absolute temperature scale, so as to obtain a deviation from the stoichiometry in compositional ratio of the compound semiconductor crystalline of the current blocking layer. This deviation from the stoichiometry in compositional ratio of the compound semiconductor crystalline introduces the excess point defects into the compound semiconductor crystalline. The excess point defects are capable of permitting non-luminance re-combinations of minority and majority carriers. A light is absorbed into the compound semiconductor crystalline of the current blocking layer, whereby electron hole pairs are generated in the compound semiconductor crystalline. The generated electrons are excited and lie on a conduction band of the compound semiconductor crystalline of the current blocking layer, whilst the generated holes lie on a valence band of the compound semiconductor crystalline of the current blocking layer. The excess point defects provide non-luminance re-combination centers of the electrons and holes, whereby the re-combination of the electrons and holes without luminance are promoted. This means that the non-luminance re-combination by the excess point defects shortens a life time of carriers, for example, electrons and holes in the compound semiconductor crystalline of the current blocking layer. This means that shortening the carrier life time shortens a diffusion length of the carriers. Namely, there appears no diffusion of minority carriers over the current blocking layer to adjacent layers nor accumulation of minority carriers in the current blocking layer, resulting in no variation of the energy band gap of the current blocking layer nor drop of potential barriers of the current blocking layer. If the above novel current blocking layer is applied to the semiconductor optical device, then such the semiconductor optical device dos not show any unintended turn-ON operation.

It is also preferable that the current blocking layer has a thickness which is larger than the diffusion length of the minority carriers in the compound semiconductor crystalline of the current blocking layer. As described above, the diffusion length of the minority carriers in the compound semiconductor crystalline of the current blocking layer is shortened by the excess point defects introduced by the deviation from the stoichiometry in compositional ratio of the compound semiconductor crystalline, for which reason a preferable range in thickness of the current blocking layer is widen. This means that a minimum value in the preferable thickness range of the current blocking layer is made thin. If the current blocking layer is provided in opposite sides of a mesa structure of a semiconductor optical device so that a top surface of the current blocking layer is leveled to a top portion of the mesa structure, then it is permitted to design the height of the mesa structure to be low by designing the thickness of the current blocking layer to be thin.

Further, no variation of the energy band gap of the current blocking layer nor drop of potential barriers of the current blocking layer makes it unnecessary that the current blocking layer has a high dopant concentration. This prevents deterioration in surface homology of the current blocking layer and a layer overlying the current blocking layer.

It is preferable that the current blocking layer is grown by a migration enhanced epitaxy method.

It is also preferable that the current blocking layer comprises a Group III-V compound semiconductor crystalline and the Group III-V compound semiconductor crystalline is formed by a pre-cracking process to Group-V hydrogenated molecules as source materials and a subsequent low temperature metal organic chemical vapor deposition method.

It is also preferable that the current blocking layer comprises a Group III-V compound semiconductor crystalline and the Group III-V compound semiconductor crystalline is formed by a low temperature metal organic chemical vapor deposition method using an organic Group-V element.

It is also preferable that the current blocking layer comprises a GaAs compound semiconductor crystalline and the GaAs compound semiconductor crystalline is grown at a temperature in the range of 150–200° C.

The eleventh present invention provides a method of forming a current confinement structure in a semiconductor laser device. The method comprises the steps of: forming a cladding layer having a mesa structure and flat surface portions outside the mesa structure; and forming current blocking layers extending at least both on the flat surface portions of the mesa structure and on side faces of the mesa structure of the cladding layer, where each of the current blocking layers comprises a compound semiconductor crystalline, wherein the compound semiconductor crystalline is grown at a temperature of not higher than 0.4 times of a melting point of the compound semiconductor crystalline in an absolute temperature scale.

In accordance with the eleventh present invention, the current blocking layer is grown by a low temperature growth of the compound semiconductor crystalline at a temperature of not higher than 0.4 times of a melting point of the compound semiconductor crystalline in an absolute temperature scale, so as to obtain a deviation from the stoichiometry in compositional ratio of the compound semiconductor crystalline of the current blocking layer. This deviation from the stoichiometry in compositional ratio of the compound semiconductor crystalline introduces the excess point defects into the compound semiconductor crystalline. The excess point defects are capable of permitting non-luminance recombinations of minority and majority carriers. A light is absorbed into the compound semiconductor crystalline of the current blocking layer, whereby electron hole pairs are generated in the compound semiconductor crystalline. The generated electrons are excited and lie on a conduction band of the compound semiconductor crystalline of the current blocking layer, whilst the generated holes lie on a valence band of the compound semiconductor crystalline of the current blocking layer. The excess point defects provide non-luminance re-combination centers of the electrons and holes, whereby the re-combination of the electrons and holes without luminance are promoted. This means that the non-luminance recombination by the excess point defects shortens a life time of carriers, for example, electrons and holes in the compound semiconductor crystalline of the current blocking layer. This means that shortening the carrier life time shortens a diffusion length of the carriers. Namely, there appears no diffusion of minority carriers over the current blocking layer to adjacent layers nor accumulation of minority carriers in the current blocking layer, resulting in no variation of the energy band gap of the current blocking layer nor drop of potential barriers of the current blocking layer. If the above novel current blocking layer is applied to the semiconductor optical device, then such the semiconductor optical device dos not show any unintended turn-ON operation.

It is also preferable that the current blocking layer has a thickness which is larger than the diffusion length of the minority carriers in the compound semiconductor crystalline of the current blocking layer. As described above, the diffusion length of the minority carriers in the compound semiconductor crystalline of the current blocking layer is shortened by the excess point defects introduced by the deviation from the stoichiometry in compositional ratio of the compound semiconductor crystalline, for which reason a preferable range in thickness of the current blocking layer is widen. This means that a minimum value in the preferable thickness range of the current blocking layer is made thin. If the current blocking layer is provided in opposite sides of a mesa structure of a semiconductor optical device so that a stop surface of the current blocking layer is leveled to a top portion of the mesa structure, then it is permitted to design the height of the mesa structure to be low by designing the thickness of the current blocking layer to be thin.

Further, no variation of the energy band gap of the current blocking layer nor drop of potential barriers of the current blocking layer makes it unnecessary that the current blocking layer has a high dopant concentration. This prevents deterioration in surface homology of the current blocking layer and a layer overlying the current blocking layer.

It is preferable that the current blocking layer is grown by a migration enhanced epitaxy method.

It is also preferable that the current blocking layer comprises a Group III-V compound semiconductor crystalline and the Group III-V compound semiconductor crystalline is formed by a pre-cracking process to Group-V hydrogenated molecules as source materials and a subsequent low temperature metal organic chemical vapor deposition method.

It is also preferable that the current blocking layer comprises a Group III-V compound semiconductor crystalline and the Group III-V compound semiconductor crystalline is formed by a low temperature metal organic chemical vapor deposition method using an organic Group-V element.

It is also preferable that the current blocking layer comprises a GaAs compound semiconductor crystalline and the GaAs compound semiconductor crystalline is grown at a temperature in the range of 150–200° C.

The twelfth present invention provides a method of forming a semiconductor laser. The method comprises the steps of: forming a double-hereto structure provided over a compound semiconductor substrate of a first conductivity type, so that the double-hetero structure has an upper flat surface; forming a mesa structure of a second conductivity type on a selected region of the upper flat surface of the double-hetero structure, so that the mesa structure has sloped side faces; forming current blocking layers comprising a compound semiconductor crystalline of the first conductivity type, so that each of the current blocking layers extends both on an unselected region of the flat surface of the double-hetero structure and on the sloped side face of the mesa structure; and forming a compound semiconductor contact layer of the second conductivity type extending over a top surface of the mesa structure and the current blocking layers, wherein the compound semiconductor crystalline is grown at a temperature of not higher than 0.4 times of a melting point of the compound semiconductor crystalline in an absolute temperature scale.

In accordance with the twelfth present invention, the current blocking layer is grown by a low temperature growth of the compound semiconductor crystalline at a temperature of not higher than 0.4 times of a melting point of the compound semiconductor crystalline in an absolute temperature scale, so as to obtain a deviation from the stoichiometry in compositional ratio of the compound semiconductor crystalline of the current blocking layer. This deviation from the stoichiometry in compositional ratio of the compound semiconductor crystalline introduces the excess point defects into the compound semiconductor crystalline. The excess point defects are capable of permitting non-luminance re-combinations of minority and majority carriers. A light is absorbed into the compound semiconductor crystalline of the current blocking layer, whereby electron hole pairs are generated in the compound semiconductor crystalline. The generated electrons are excited and lie on a conduction band of the compound semiconductor crystalline of the current blocking layer, whilst the generated holes lie on a valence band of the compound semiconductor crystalline of the current blocking layer. The excess point defects provide non-luminance re-combination centers of the electrons and holes, whereby the re-combination of the electrons and holes without luminance are promoted. This means that the non-luminance re-combination by the excess point defects shortens a life time of carriers, for example, electrons and holes in the compound semiconductor crystalline of the current blocking layer. This means that shortening the carrier life time shortens a diffusion length of the carriers. Namely, there appears no diffusion of minority carriers over the current blocking layer to adjacent layers nor accumulation of minority carriers in the current blocking layer, resulting in no variation of the energy band gap of the current blocking layer nor drop of potential barriers of the current blocking layer. If the above novel current blocking layer is applied to the semiconductor optical device, then such the semiconductor optical device dos not show any unintended turn-ON operation.

It is also preferable that the current blocking layer has a thickness which is larger than the diffusion length of the minority carriers in the compound semiconductor crystalline of the current blocking layer. As described above, the diffusion length of the minority carriers in the compound semiconductor crystalline of the current blocking layer is shortened by the excess point defects introduced by the deviation from the stoichiometry in compositional ratio of the compound semiconductor crystalline, for which reason a preferable range in thickness of the current blocking layer is widen. This means that a minimum value in the preferable thickness range of the current blocking layer is made thin. If the current blocking layer is provided in opposite sides of a mesa structure of a semiconductor optical device so that a top surface of the current blocking layer is leveled to a top portion of the mesa structure, then it is permitted to design the height of the mesa structure to be low by designing the thickness of the current blocking layer to be thin.

Further, no variation of the energy band gap of the current blocking layer nor drop of potential barriers of the current blocking layer makes it unnecessary that the current blocking layer has a high dopant concentration. This prevents deterioration in surface homology of the current blocking layer and a layer overlying the current blocking layer.

It is also preferable that the current blocking layer is grown by a migration enhanced epitaxy method.

It is also preferable that the current blocking layer comprises a Group III-V compound semiconductor crystalline and the Group III-V compound semiconductor crystalline is formed by a pre-cracking process to Group-V hydrogenated molecules as source materials and a subsequent low temperature metal organic chemical vapor deposition method.

It is also preferable that the current blocking layer comprises a Group III-V compound semiconductor crystalline and the Group III-V compound semiconductor crystalline is formed by a low temperature metal organic chemical vapor depression method using an organic Group-V element.

It is also preferable that the current blocking layer comprises a GaAs compound semiconductor crystalline and the GaAs compound semiconductor crystalline is grown at a temperature in the range of 150–200° C.

PREFERRED EMBODIMENTS

FIRST EMBODIMENT

Figure 4:
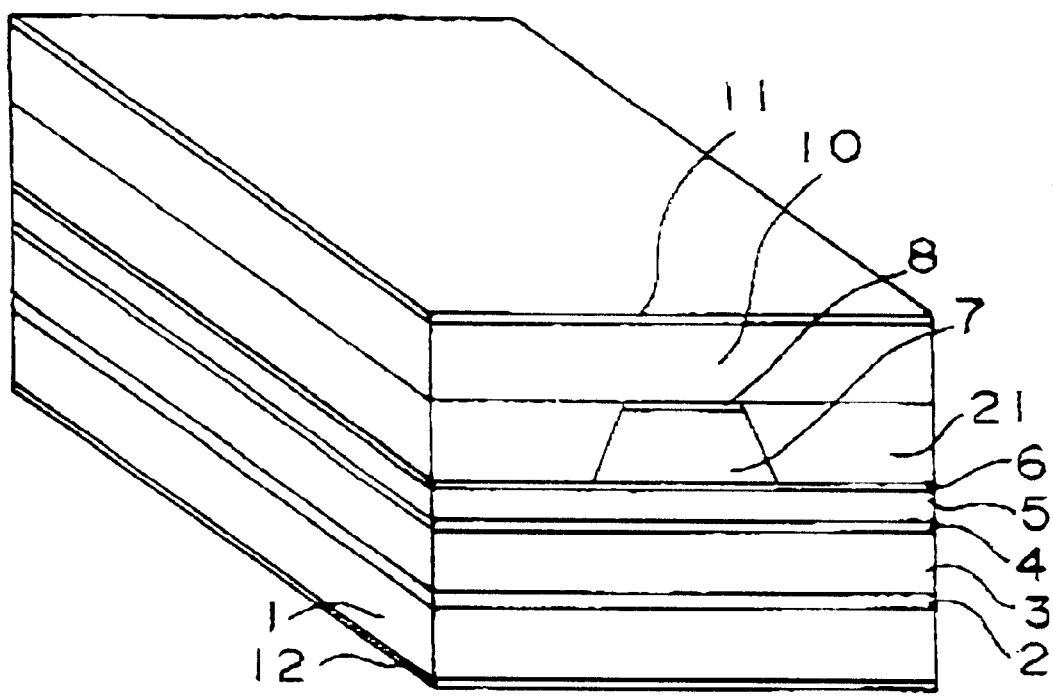
FIG. 4 is a schematic perspective view illustrative of a novel semiconductor laser device having improved current blocking layers in a preferred embodiment in accordance with the present invention.
Figure 5:
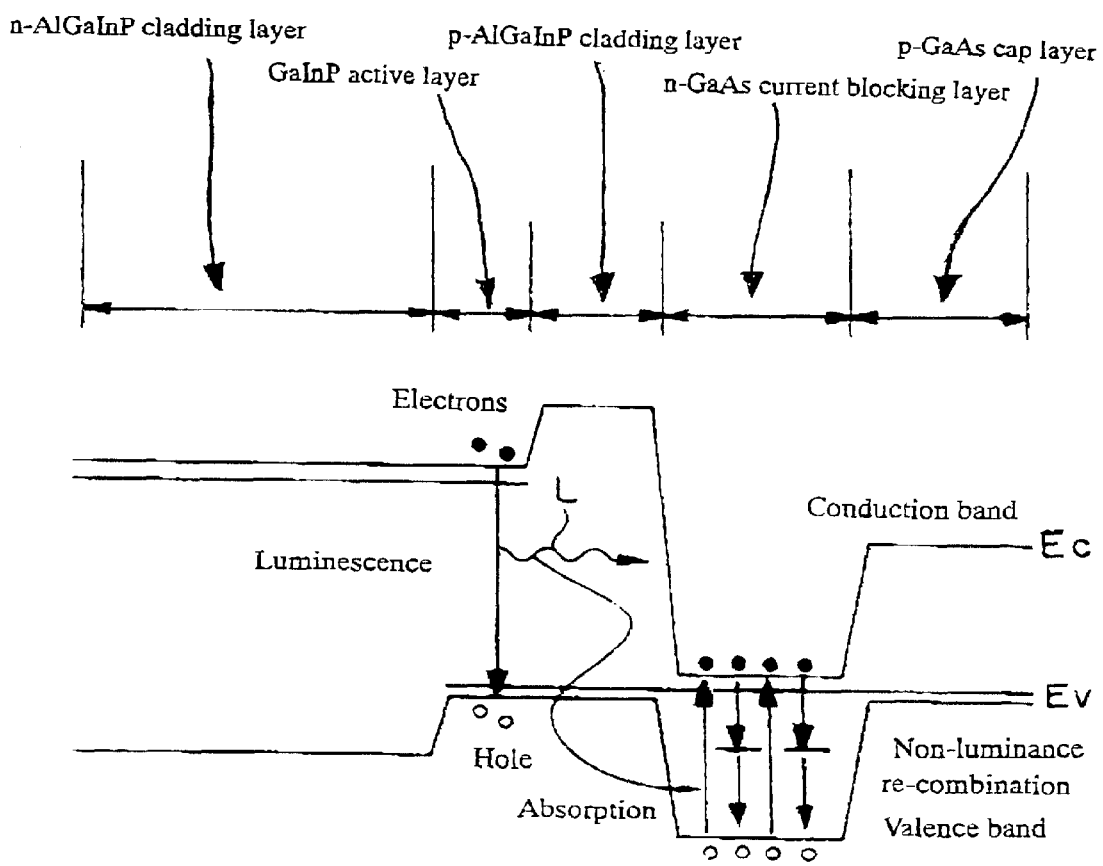
FIG. 5 is a diagram illustrative of an energy band gap profile across a double hetero-structure and an improved current blocking layer as well as a cap layer overlying the improved current blocking layer in a preferred embodiment in accordance with the present invention.

A first embodiment according to the present invention will be described in detail with reference to FIGS. 4 and 5. FIG. 4 is a schematic perspective view illustrative of a novel semiconductor laser device having improved current blocking layers. FIG. 5 is a diagram illustrative of an energy band gap profile across a double hetero-structure and an improved current blocking layer as well as a cap layer overlying the improved current blocking layer.

An n-GaAs buffer layer 2 is provided on an n-GaAs substrate 1. An n-AlGaInP first cladding layer 3 is provided on the n-GaAs buffer layer 2. An active layer 4 is provided on the n-AlGaInP first cladding layer 3. The active layer 4 may comprise a multiple quantum well structure which comprises alternating laminations of GaInP well layers and AlGaInP barrier layers. A p-AlGaInP second cladding layer 5 is provided on the active layer 4. A p-GaInP etching support layer 6 is also provided on the p-AlGaInP second cladding layer 5. A p-AlGaInP stripe-shaped mesa structure 7 serving as a part of the cladding layer is provided on a selected region of the p-GaInP etching stopper layer 6. A p-GaInP hetero-buffer layer is provided on a top surface of the p-AlGaInP layer. Improved current blocking layers 21 are provided on the p-GaInP etching support layer 6 so that the improved current blocking layers 21 are positioned in both sides of laminations of the p-AlGaInP stripe-shaped mesa structure 7 and the p-GaInP hetero-buffer layer 8. A p-GaAs cap layer 10 is provided over the p-GaInP hetero-buffer layer 8 and top surfaces of the improved current blocking layers 21. An n-electrode 11 is provided on a bottom surface of the n-GaAs substrate 1. A p-electrode 12 is also provided on a top surface of the p-GaAs cap layer 10.

The improved current blocking layers 21 is made of an n-GaAs binary GaAs compound semiconductor crystalline which has a deviation from the stoichiometry in compositional ratio of GaAs to introduce excess point defects into the GaAs compound semiconductor crystalline. As illustrated in FIG. 5, the excess point defects provide non-luminance re-combination centers which are capable of permitting non-luminance re-combinations of minority and majority carriers. A light is absorbed into the GaAs compound semiconductor crystalline of the current blocking layers 21, whereby electron hole pairs are generated in the GaAs compound semiconductor crystalline. The generated electrons represented by "●" are excited and lie on a conduction band of the GaAs compound semiconductor crystalline of the current blocking layers 21, whilst the generated holes represented by "○" lie on a valence band of the GaAs compound semiconductor crystalline of the current blocking layers 21. The excess point defects provide non-luminance re-combination centers represented by "—" of the electrons and holes, whereby the re-combination of the electrons and holes without luminance are promoted. This means that the non-luminance re-combination by the excess point defects shortens a life time of carriers, for example, electrons and holes in the GaAs compound semiconductor crystalline of the current blocking layers 21. This means that shortening the carrier life time shortens a diffusion length of the carriers. As illustrated in FIG. 5, the promotion of non-luminance re-combination by the excess point defects results in no diffusion of the holes as minority carriers over the current blocking layers 21 to adjacent layers, for example, the p-AlGaInP second cladding layer 5 and the p-GaAs cap layer 10 nor accumulation of the electrons as minority carriers in the current blocking layers 21, resulting in no variation of the energy band gap of the current blocking layers 21 nor drop of potential barriers of the current blocking layers 21. The semiconductor laser device dos not show any unintended turn-ON operation.

The above deviation from the stoichiometry in compositional ratio of the GaAs compound semiconductor crystalline of the current blocking layers 21 is obtained by a low temperature growth of the GaAs compound semiconductor crystalline at a temperature of not higher than 0.4 times of a melting point of the GaAs compound semiconductor crystalline in the absolute temperature scale, for example, in a range of 150–200° C. The technique of the low temperature growth of compound semiconductor is disclosed by M. Kaminska et al. in Applied Physics Letters, Vol. 54 pp. 1881–1883 (1989).

The current blocking layers 21 have a thickness which is larger than the diffusion length of the holes as the minority carriers in the GaAs compound semiconductor crystalline of the current blocking layers 21. As described above, the diffusion length of the holes as the minority carriers in the GaAs compound semiconductor crystalline of the current blocking layers 21 is shortened by the excess point defects introduced by the deviation from the stoichiometry in compositional ratio of the GaAs compound semiconductor crystalline, for which reason a preferable range in thickness of the current blocking layers 21 is widen. This means that a minimum value in the preferable thickness range of the current blocking layers 21 is made thin.

Further, no variation of the energy band gap of the current blocking layers 21 nor drop of potential barriers of the current blocking layers 21 makes it unnecessary that the current blocking layers 21 has a high dopant concentration. This prevents deterioration in surface homology of the current blocking layers 21 and a layer overlying the current blocking layers 21.

The above novel laser device having the improved current blocking layers may be fabricated by two times of a metal organic vapor phase epitaxy and a single time of a migration enhanced epitaxy.

A first metal organic vaport phase epitaxy is carried out so that an n-GaAs buffer layer 2 having a thickness of 0.3 micrometers is provided on a (115)A-orientated surface of an n-GaAs substrate 1. Further, an n-AlGaInP first cladding layer 3 having a thickness of 1.2 micrometers is provided on the n-GaAs buffer layer 2 by the first metal organic vapor phase epitaxy. Furthermore, an active layer 4 is provided on the n-AlGaInP first cladding layer 3 by the first metal organic vapor phase epitaxy. The active layer 4 may comprise a multiple quantum well structure which comprises alternating laminations of GaInP well layers having a thickness of 8 nanometers and AlGaInP barrier layers having a thickness of 4 nanometers. A p-AlGaInP second cladding layer 5 having a thickness of 0.25 micrometers is provided on the active layer 4 by the first metal organic vaport phase epitaxy. A p-GaInP etching stopper layer 6 having a thickness of 5 nanometers is also provided on the p-AlGaInP second cladding layer 5 by the first metal organic vapor phase epitaxy. A p-AlGaInP layer having a thickness of 0.95 micrometers is provided on the p-GaInP etching stopper layer 6 by the first metal organic vapor phase epitaxy. A p-GaInP hetero-buffer layer having a thickness of 10 nanometers is provided on the p-AlGaInP stripe-shaped mesa structure 7 by the first metal organic vapor phase epitaxy.

A stripe-shaped $SiO_2$ dielectric mask pattern not illustrated is provided on a selected region of the p-GaInP hetero-buffer layer. A wet etching process is carried out to selectively etch laminations of the p-AlGaInP layer and the p-GaInP hetero-buffer layer, whereby a p-GaInP hetero-buffer layer 8 is provided on a top surface of the p-AlGaInP stripe-shaped mesa structure 7.

The above stripe-shaped $SiO_2$ dielectric mask pattern is used again to carry out a low temperature migration enhanced epitaxy method at a low temperature of not higher than 0.4 times of a melting point of the GaAs compound semiconductor crystalline in the absolute temperature scale, for example, in the range of 150–200° C., preferably at 200° C. to grow the n-GaAs compound semiconductor crystalline layers including the excess point defects as current blocking layers 21 on the p-GaInP etching stopper layer 6, so that the improved current blocking layers 21 are positioned in both sides of laminations of the p-AlGaInP stripe-shaped mesa structure 7 and the p-GaInP hetero-buffer layer 8. The improved current blocking layers 21 have a thickness of 1.0 micrometer. The migration enhanced epitaxy method is different from a molecular beam epitaxy method in a discontinuous supply of Group III element Ga in order to promote a diffusion of Group III element Ga on growth surface to rise a selectivity.

A second metal organic vapor phase epitaxy method is carried out to grow a p-GaAs cap layer 10 over the p-GaInP hetero-buffer layer 8 and to surfaces of the improved current blocking layers 21. An n-electrode 11 is provided on a bottom surface of the n-GaAs substrate 1. A p-electrode 12 is also provided on a top surface of the p-GaAs cap layer 10. The substrate 1 is then cleaved and subsequently a cleaved edge of the n-GaAs substrate 1 is coated to complete a semiconductor laser device.

As described above, the current blocking layers 21 are grown by a low temperature growth of the GaAs compound semiconductor crystalline at a temperature of not higher than 0.4 times of the melting point of the GaAs compound semiconductor crystalline in the absolute temperature scale, so as to obtain the deviation from the stoichiometry in compositional ratio of the GaAs compound semiconductor crystalline of the current blocking layers 21. This deviation from the stoichiometry in compositional ratio of the GaAs compound semiconductor crystalline introduces the excess point defects into the GaAs compound semiconductor crystalline. The excess point defects are capable of permitting non-luminance re-combinations of minority and majority carriers. A light is absorbed into the GaAs compound semiconductor crystalline of the current blocking layers 21, whereby electron hole pairs are generated in the GaAs compound semiconductor crystalline. The generated electrons are excited and lie on a conduction band of the GaAs compound semiconductor crystalline of the current blocking layers 21, whilst the generated holes lie on a valence band of the GaAs compound semiconductor crystalline of the current blocking layers 21. The excess point defects provide non-luminance re-combination centers of the electrons and holes, whereby the re-combination of the electrons and holes without luminance are promoted. This means that the non-luminance re-combination by the excess point defects shortens a life time of carriers, for example, electrons and holes in the GaAs compound semiconductor crystalline of the current blocking layers 21. This means that shortening the carrier life time shortens a diffusion length of the carriers. Namely, there appears no diffusion of minority carriers over the current blocking layers 21 to adjacent layers nor accumulation of minority carriers in the current blocking layers 21, resulting in no variation of the energy band gap of the current blocking layers 21 nor drop of potential barriers of the current blocking layers 21.

The current blocking layers 21 has a thickness of 1.0 micrometers which is larger than the diffusion length of the minority carriers in the GaAs compound semiconductor crystalline of the current blocking layers 21. As described above, the diffusion length of the minority carriers in the GaAs compound semiconductor crystalline of the current blocking layers 21 is shortened by the excess point defects introduced by the deviation from the stoichiometry in compositional ratio of the GaAS compound semiconductor crystalline, for which reason a preferable range in thickness of the current blocking layers 21 is widen. This means that a minimum value in the preferable thickness range of the current blocking layers 21 is made thin. It is permitted to design the height of the mesa structure to be low by designing the thickness of the current blocking layers 21 to the thin.

Further, no variation of the energy band gap of the current blocking layers 21 nor drop of potential barriers of the current blocking layers 21 makes it unnecessary that the current blocking layers 21 has a high dopant concentration. This prevents deterioration in surface homology of the current blocking layers 21 and a layer overlying the current blocking layers 21.

It was confirmed that the above laser device is capable of emitting a laser beam having a wavelength of 650 nanometers. It was also confirmed that the above laser device possesses required output characteristics and high reliability.

It was also confirmed that the above low temperature growth of the GaAs compound semiconductor crystalline of the current blocking layers 21 prevents a deterioration of the active layer 4 due to a heat of the crystal growth process of the GaAs compound semiconductor crystalline.

It was also confirmed that the above current blocking layers 21 having the excess point defects introduced by the deviation to the deviation from the stoichiometry in compositional ratio of the GaAs compound semiconductor crystalline of the current blocking layers 21 are free from the problems with unintended turning ON operations due to the absorption of an emission light into the current blocking layers 21.

It was also confirmed that the above current blocking layers 21 have the required high voltage characteristics.

As a modification to the above preferred embodiment, it is possible to replace the above migration enhanced epitaxy method by other method such as a pre-cracking to pre-cracking process to Group-V hydrogenated molecules, for example, $AsH_3$ as source materials at a temperature of 800° C. and a subsequent low temperature metal organic chemical vapor deposition method.

As a further modification to the above preferred embodiment, it is also possible to replace the above migration enhanced epitaxy method by a subsequent low temperature metal organic chemical vapor deposition method by supplying an organic Group V element, for example, TBAs which has a lower decomposition temperature than $AsH_3$.

As a further more modification to the above preferred embodiment, it is also possible to replace the above metal organic vapor phase epitaxy to grow the double hetero structure by other growth methods.

As a still further modification to the above preferred embodiment, it is also possible to replace the AlGaInP-based compound semiconductors for the double hetero structure by other compound semiconductors such as other Group III-V compound semiconductors, for example, InGaAs/AlGaAs-based compound semiconductors to form an AlGaInP-based visible semiconductor laser device.

As yet further modification to the above preferred embodiment, it is also possible to replace the GaAs-based compound semiconductor for the current blocking layers by other compound semiconductors such as other Group III-V compound semiconductors, for example, AlGaAs or AlAs compound semiconductors.

It is available that the above double hetero-structure includes at least one selection from a group consisting of GaInP, AlGaInP and AlInP. In this case, the current blocking layers may include at least one selected from a group consisting of GaAs, AlGaAs, and AlAs.

It is also available that the above double hetero-structure includes at least one selected from a group consisting of InGaAs, GaAs and AlGaAs. In this case, the current blocking layers may include at least one selected from a group consisting of GaAs, AlGaAs, and AlAs.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A current blocking layer for current confinement, said current blocking layer comprising a crystalline semiconductor compound,
   wherein said crystalline semiconductor compound deviates from stoichiometry in compositional ratio so that said crystalline semiconductor compound has excess point defects.

2. The current blocking layer as claimed in claim 1, wherein said current blocking layer has a thickness which is greater than a diffusion length of minority carriers in said crystalline semiconductor compound.

3. The current blocking layer as claimed in claim 1, wherein said crystalline semiconductor compound comprises an As-based crystalline semiconductor compound.

4. The current blocking layer as claimed in claim 3, wherein said As-based crystalline semiconductor compound includes at least one selected from the group consisting of GaAs, AlGaAs and AlAs.

5. The current blocking layer as claimed in claim 1, wherein said crystalline semiconductor compound comprises a Group III-V crystalline semiconductor compound.

6. A current confinement structure in a semiconductor laser device, said current confinement structure comprising:
   a cladding layer having a mesa structure and flat surface portions outside said mesa structure;
   current blocking layers extending at least both on said flat surface portions of said mesa structure and on side faces of said mesa structure of said cladding layer, and each of said current blocking layers comprising a crystalline semiconductor compound,
   wherein said crystalline semiconductor compound deviates from stoichiometry in compositional ratio so that said crystalline semiconductor compound has excess point defects.

7. The current confinement structure as claimed in claim 6, wherein said current blocking layer has a thickness which is greater than a diffusion length of minority carriers in said crystalline semiconductor compound.

8. The current confinement structure as claimed in claim 6, wherein said crystalline semiconductor compound comprises an As-based crystalline semiconductor compound.

9. The current confinement structure as claimed in claim 8, wherein said As-based crystalline semiconductor compound includes at least one selected from the group consisting of GaAs, AlGaAs and AlAs.

10. The current confinement structure as claimed on claim 6, wherein said crystalline semiconductor compound comprises a Group III-V crystalline semiconductor compound.

11. A current blocking layer for a current confinement, said current blocking layer comprising a crystalline semiconductor compound,
    wherein said crystalline semiconductor compound has excess point defects which are capable of permitting non-luminance re-combinations of minority and majority carriers.

12. The current blocking layer as claimed in claim 11, wherein said current blocking layer has a thickness which is greater than a diffusion length of said minority carriers in said crystalline semiconductor compound.

13. The current blocking layer has claimed in claim 11, wherein said crystalline semiconductor compound comprises an As-based crystalline semiconductor compound.

14. The current blocking layer as claimed in claim 13, wherein said As-based crystalline semiconductor compound includes at least one selected from the group consisting of GaAs, AlGaAs and AlAs.

15. The current blocking layer as claimed in claim 11, wherein said crystalline semiconductor compound comprises a Group III-V crystalline semiconductor compound.

16. A current embodiment confinement structure in a semiconductor laser device, said current confinement structure comprising:
    a cladding layer having a mesa structure and flat surface portions outside and mesa structure;
    current blocking layers extending at least both on said flat surface portions of said mesa structure and on side faces of said mesa structure of said cladding layer, and each of said current blocking layers comprising a crystalline semiconductor compound,
    wherein said crystalline semiconductor compound has excess point defects which are capable of permitting non-luminance re-combinations of minority and majority carriers.

17. The current confinement structure as claimed in claim 16, wherein said current blocking layer has a thickness which is greater than a diffusion length of minority carriers in said crystalline semiconductor compound.

18. The current confinement structure as claimed in claim 16, wherein said crystalline semiconductor compound comprises an As-based crystalline semiconductor compound.

19. The current confinement structure layer as claimed in claim 18, wherein said As-based crystalline semiconductor compound includes at least one selected from the group consisting of GaAs, AlGaAs and AlAs.

20. The current confinement structure as claimed in claim 16, wherein said crystalline semiconductor compound comprises a Group III-V crystalline semiconductor compound.

21. A current blocking layer for an current confinement, said current blocking layer comprising a crystalline semiconductor compound,
    wherein said crystalline semiconductor compound has been grown at a temperature of not higher than 4.0 times of a melting point of said crystalline semiconductor compound in an absolute temperature scale so that said crystalline semiconductor compound deviates from stoichiometry in compositional ratio so that said crystalline semiconductor compound has excess point defects.

22. The current blocking layer as claimed in claim 21, wherein said current blocking layer has a thickness which is greater than a diffusion length of said minority carriers in said crystalline semiconductor compound.

23. The current blocking layer as claimed in claim 21, wherein said crystalline semiconductor compound comprises an As-based crystalline semiconductor compound.

24. The current blocking layer as claimed in claim 23, wherein said As-based crystalline semiconductor compound includes at least one selected from the group consisting of GaAs, AlGaAs and AlAs.

25. The current blocking layer as claimed in claim 21, wherein said crystalline semiconductor compound comprises a Group III-V crystalline semiconductor compound.

26. A current confinement structure in a semiconductor laser device, and current confinement structure comprising:
a cladding layer having a mesa structure and flat surface portions outside said mesa structure;
current blocking layers extending at least both on said flat surface portions of said mesa structure and on side faces of said mesa structure of said cloning layer, and each of said current blocking layers comprising a crystalline semiconductor compound,
wherein said crystalline semiconductor compound has been grown at a temperature of not higher than 0.4 times of a melting point of said crystalline semiconductor compound in an absolute temperature scale so that said crystalline semiconductor compound deviates from stoichiometry in compositional ratio so that said crystalline semiconductor compound has excess point defects.

27. The current confinement structure as claimed in claim 26, wherein said current blocking layer has a thickness which is greater than a diffusion length of minority carriers in said crystalline semiconductor compound.

28. The current confinement structure as claimed in claim 26, wherein said crystalline semiconductor compound comprises an As-based crystalline semiconductor compound.

29. The current confinement structure layer as claimed in claim 28, wherein said As-based crystalline semiconductor compound includes at least one selected from the group consisting of GaAs, AlGaAs and AlAs.

30. The current confinement structure as claimed in claim 26, wherein said crystalline semiconductor compound comprises a Group III-V crystalline semiconductor compound.

31. A semiconductor laser comprising:
a compound semiconductor substrate of a first conductivity type;
a double-hetero structure provided over said compound semiconductor substrate, and said double-hetero structure having an upper flat surface;
a mesa structure of a second conductivity type provided on a selected region of said upper flat surface of said double-hetero structure, and said mesa structure having sloped side faces;
current blocking layers of said first conductivity type, each of said current blocking layers extending both on an unselected region of said flat surface of said double-hetero structure and on said sloped side face of said mesa structure; and
a semiconductor compound contact layer of said second conductivity type extending over a top surface of said mesa structure and said current blocking layers,
wherein each of said current blocking layers comprise a crystalline semiconductor compound which deviates from stoichiometry in compositional ratio so that said crystalline semiconductor compound has excess point defects.

32. The semiconductor laser as claimed in claim 31, wherein said current blocking layer has a thickness which is greater than a diffusion length of minority carriers in said crystalline semiconductor compound.

33. The semiconductor laser as claimed in claim 31, wherein said crystalline semiconductor compound comprises an As-based crystalline semiconductor compound.

34. The semiconductor laser as claimed in claim 33, wherein said As-based crystalline semiconductor compound includes at least one selected from the group consisting of GaAs, AlGaAs and AlAs.

35. The semiconductor laser as claimed in claim 31, wherein said crystalline semiconductor compound comprises a Group III-V crystalline semiconductor compound.

36. A semiconductor laser comprising:
a compound semiconductor substrate of a first conductivity type;
a double-hetero structure provided over said compound semiconductor substrate, and said double-hetero structure having an upper flat surface;
a mesa structure of a second conductivity type provided on a selected region of said upper flat surface of said double-hetero structure, and said mesa structure having sloped side faces;
current blocking layers of said first conductivity type, each of said current blocking layers extending both on an unselected region of said flat surface of said double-hetero structure and on said sloped side face of said mesa structure; and
a semiconductor compound contact layer of said second conductivity type extending over a top surface of said mesa structure and said current blocking layers,
wherein each of said current blocking layers comprises a crystalline semiconductor compound which has excess point defects which are capable of permitting non-luminance re-combinations of minority and majority carriers.

37. The semiconductor laser as claimed in claim 36, wherein said current blocking layer has a thickness which is greater than a diffusion length of said minority carriers in said crystalline semiconductor compound.

38. The semiconductor laser as claimed in claim 36, wherein said crystalline semiconductor compound comprises an As-based crystalline semiconductor compound.

39. The semiconductor laser as claimed in claim 38, wherein said As-based crystalline semiconductor compound includes at least one selected from the group consisting of GaAs, AlGaAs and AlAs.

40. The semiconductor laser as claimed in claim 36, wherein said crystalline semiconductor compound comprises a Group III-V crystalline semiconductor compound.

41. A semiconductor laser comprising:
a compound semiconductor substrate of a first conductivity type;
a double-hetero structure provided over said compound semiconductor substrate, and said double-hetero structure having an upper flat surface;

a mesa structure of a second conductivity type provided on a selected region of said upper flat surface of said double-hetero structure, and said mesa structure having sloped side faces;

current blocking layers of said first conductivity type, each of said current blocking layers extending both on an unselected region of said flat surfaces of said double-hetero structure and on said sloped side face of said mesa structure; and a semiconductor compound contact layer of said second conductivity type extending over a top surface of said mesa structure and said current blocking layers, wherein each of said current blocking layers comprises a crystalline semiconductor compound which has been grown at a temperature of not higher than 0.4 times of a melting point of said crystalline semiconductor compound in an absolute temperature scale so that said crystalline semiconductor compound deviates from stoichiometry in compositional ratio so that said crystalline semiconductor compound has excess point defects.

42. The current blocking layer as claimed in claim 41, wherein said current blocking layer has a thickness which is greater than a diffusion length of said minority carriers in said crystalline semiconductor compound.

43. The semiconductor laser as claimed in claim 41, wherein said crystalline semiconductor compound comprises an As-based crystalline semiconductor compound.

44. The semiconductor laser as claimed in claim 43, wherein said As-based crystalline semiconductor compound includes at least one selected from the group consisting of GaAs, AlGaAs and AlAs.

45. The semiconductor laser as claimed in claim 41, wherein said crystalline semiconductor compound comprises a Group III-V crystalline semiconductor compound.

* * * * *